United States Patent [19]
Koerner et al.

[11] Patent Number: 5,283,631
[45] Date of Patent: Feb. 1, 1994

[54] PROGRAMMABLE CAPACITANCE DELAY ELEMENT HAVING INVERTERS CONTROLLED BY ADJUSTABLE VOLTAGE TO OFFSET TEMPERATURE AND VOLTAGE SUPPLY VARIATIONS

[75] Inventors: Christopher Koerner, Longmont; Alberto Gutierrez, Jr., Fort Collins; Edward G. Pumphrey, Colorado Springs, all of Colo.

[73] Assignee: Hewlett-Packard Co., Palo Alto, Calif.

[21] Appl. No.: 786,633

[22] Filed: Nov. 1, 1991

[51] Int. Cl.$^5$ .................... H03K 5/13; H03K 19/20
[52] U.S. Cl. .................... 307/451; 307/443; 307/594; 307/597
[58] Field of Search .................... 307/451, 443, 296.1, 307/594, 597, 601, 603, 605, 606, 463, 491

[56] References Cited

U.S. PATENT DOCUMENTS

| | | | |
|---|---|---|---|
| 3,660,647 | 5/1972 | Pryor, Jr. | 328/55 |
| 4,028,979 | 6/1977 | Luce | 331/57 |
| 4,266,197 | 5/1981 | Breithaupt | 328/55 |
| 4,473,762 | 9/1984 | Iwahashi et al. | 307/443 |
| 4,489,342 | 12/1984 | Gollinger et al. | 307/605 |
| 4,499,387 | 2/1985 | Konishi | 307/443 |
| 4,504,749 | 3/1985 | Yoshida | 307/590 |
| 4,626,716 | 12/1986 | Miki | 307/602 |
| 4,638,191 | 1/1987 | Baumgartner et al. | 307/443 |
| 4,644,184 | 2/1987 | Miyawaki et al. | 307/601 |
| 4,700,089 | 10/1987 | Fujii et al. | 307/605 |
| 4,714,924 | 12/1987 | Ketzler | 307/602 |
| 4,754,164 | 6/1988 | Flora et al. | 307/269 |
| 4,845,390 | 7/1989 | Chan | 307/602 |
| 4,894,791 | 1/1990 | Jiang et al. | 307/597 |
| 4,899,071 | 2/1990 | Morales | 307/605 |
| 4,922,140 | 5/1990 | Gahle et al. | 307/443 |
| 4,947,064 | 8/1990 | Kim et al. | 307/594 |
| 5,012,141 | 4/1991 | Tomisawa | 307/451 |
| 5,028,824 | 7/1991 | Young | 307/603 |
| 5,081,380 | 1/1992 | Chen | 307/594 |

OTHER PUBLICATIONS

"A 10-ps Resolution, Process-Insensitive Timing Generator IC", Otsuji et al., IEEE Journal of Solid-State Circuits, vol. 24, No. 5, Oct. 19, 1989, pp. 1412-1418.

"Integrated Pin Electronics for VLSI Functional Testers", Gasbarro et al., IEEE Journal of Solid State Circuits, vol. 24, No. 2, Apr. '89, pp. 331-337.

"Bt605 125 MHz 10KH ECL Compatible Programmable Timing Edge Vernier" Brooktree Corp. 9950 Barnes Canyon Rd., San Diego, Calif. 92121, pp. 9-1-7-9-28.

"Integrated Pin Electronics For A VLSI Test System", Branson et al., IEEE 1988 International Test Conference, pp. 23-27.

Primary Examiner—William L. Sikes
Assistant Examiner—Toan Tran

[57] ABSTRACT

A delay element for fine tuning the position in time of timing edges of an input signal, comprising a first and a second inventer, each comprising a data input, a control input and a data output. The delay element further comprises a node comprised of a connection between the data output of the first inverter and the data input of the second inverter. An adjustable control voltage is included for applying a biasing voltage to the first and second control inputs to thereby control the amount of charge supplied to the node. Finally, the variable capacitance means is connected to the node for applying finite amounts of capacitance to the node to delay and thereby fine tune in time the timing edges of the input signal propagating from the first inverter to the second inverter.

10 Claims, 2 Drawing Sheets

PROGRAMMABLE CAPACITANCE DELAY ELEMENT HAVING INVERTERS CONTROLLED BY ADJUSTABLE VOLTAGE TO OFFSET TEMPERATURE AND VOLTAGE SUPPLY VARIATIONS

CROSS REFERENCE TO RELATED APPLICATIONS

The following applications are of common assignee and contain some common disclosure, and are believed to have an effective filing date identical with that of the present application:
VARIABLE WIDTH CURRENT MIRROR DIGITAL-TO-ANALOG CONVERTER (DAC) SYSTEM AND METHOD FOR GENERATING A CONTROL VOLTAGE FOR DELAY GENERATION, Ser. No. 07/786,690;
PSEUDO-NMOS FINE/COARSE WIRED-OR TAPPED DELAY LINE, Ser. No. 07/786,459; and
CMOS PSEUDO-NMOS PROGRAMMABLE CAPACITANCE TIME VERNIER SYSTEM AND METHOD FOR CONTROLLED DELAY OF TIMING EDGES, Ser. No. 07/786,695.
The disclosure of the above cases are incorporated herein by reference as if set forth in full below.

BACKGROUND OF THE INVENTION

1. Field of the Invention

The field of the present invention relates generally to electronic systems where accurate and stable signal edge placement is required. More particularly, the present invention relates to a psuedo-NMOS programmable capacitance delay element and a method for operation of the same.

2. Related Art

Many conventional discrete and gate array devices are used in the electronics industry for adjusting the phase of digital signals. Such phase adjustment is typically accomplished by delaying the rising or falling edge of the digital pulses. Examples of such discrete devices are shown in U.S. Pat. No. 4,947,064 to Kim, U.S. Pat. No. 4,899,071 to Morales, and U.S. Pat. No. 4,806,804 to O'Leary. All teach circuits to implement such delays. An implementation of a delay circuit for gate array LSI is taught by U.S. Pat. No. 4,700,089 to Fujii, et al.

However, due to the power supply, temperature, and manufacturing process variations the discrete amounts of delay produced by the conventional circuits can vary. Such inaccuracies are acceptable in most general applications of the delay elements, but are unacceptable for systems such as testing and calibration systems.

SUMMARY OF THE INVENTION

The present invention provides a system and method that can be used for low cost timing edge placement in electrical systems. One such application is integrated circuit testing in computer test systems for providing fine tuning of a coarse timing edge input signal by providing programmable capacitance on the internal node of a buffer. Fine tuning of a coarse timing edge is useful for adjusting and characterizing integrated circuit chips, for example.

The programmable, variable capacitance is obtained by modulating the gate-source-drain voltage ($V_{GSS}$) of an NMOS FET where $V_{GSS}$ means gate to source voltage with drain shorted to source. The gate of the NMOS FET is connected to the internal node of the buffer. The source and drain electrodes are shorted together. The gate capacitance is effectively switched in or out of the circuit by driving the source-drain node to the negative or positive supply voltage, respectively. Several of these capacitors are attached to the internal node. Thus, small finely controlled amounts of capacitance can be added to the internal node via digital control. As is evident to those skilled in the art, the size of the capacitor FET is chosen corresponding to the fine timing resolution required by an application of the present invention. The number of capacitors attached to the internal node is determined by the dynamic range requirements. Since the delay of the element is linearly dependent on the capacitance of the internal node, this technique offers a linear relationship between the programmed capacitor setting and the delay of the circuit. For the present invention, the higher order capacitors are implemented as capacitor banks in order to reduce non-linearities.

This pseudo-NMOS implementation is utilized for delaying negative timing edges. Further embodiments of the present invention include pseudo-PMOS circuits for controlled delay of positive timing edges. Still further embodiments of the present invention include pseudo-NMOS/PMOS circuits for controlled delay of both negative and positive edges. This particular delay can be accomplished by either alternating a pseudo-PMOS element and a pseudo-NMOS element or by constructing an element with both PMOS and NMOS control voltages.

FEATURES AND ADVANTAGES OF THE INVENTION

The present invention overcomes the deficiencies of known techniques, as noted above, and further provides for the following advantages.

One advantage of using pseudo-NMOS devices includes the fact that the control voltage can be used to set the speed of the device; in essence, a control is provided so that a user can compensate for process variations, for example. Another advantage of this invention is that fine adjustments in delay, on top of the nominal delay set by the control voltage, can be obtained by the programmable capacitance.

The present invention is implemented using a variation of CMOS technology, which provides more functionality at a greatly reduced power requirement compared to similar implementations with other technologies requiring more power. As a result, this system is more easily integrated with other systems that are implemented using CMOS rather than, for example, bipolar technology. Further, since CMOS provides more functionality at greatly reduced power, the need for water cooling required for some applications using bipolar parts is eliminated.

The present invention provides a general method for temperature and power supply compensation based on a current referenced current mirror and pseudo-NMOS circuitry. This compensation significantly reduces the sensitivity in delay to temperature and power supply as compared to conventional CMOS. This pseudo-NMOS circuitry has good linearity of delay versus DAC digital input signal and also lends itself very well to implementation of a high performance VLSI integrated circuit chip.

The power supply sensitivity of delay for psuedo-NMOS is opposite of conventional CMOS so that these two types of circuits can be combined to minimize the power supply sensitivity.

This delay element is suitable for use in high throughput applications as compared to the classical ramp comparator technique implemented in bipolar technology.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the figures in which:

DETAILED DESCRIPTION OF THE PREFERRED EMBODIMENTS

Figure 1:
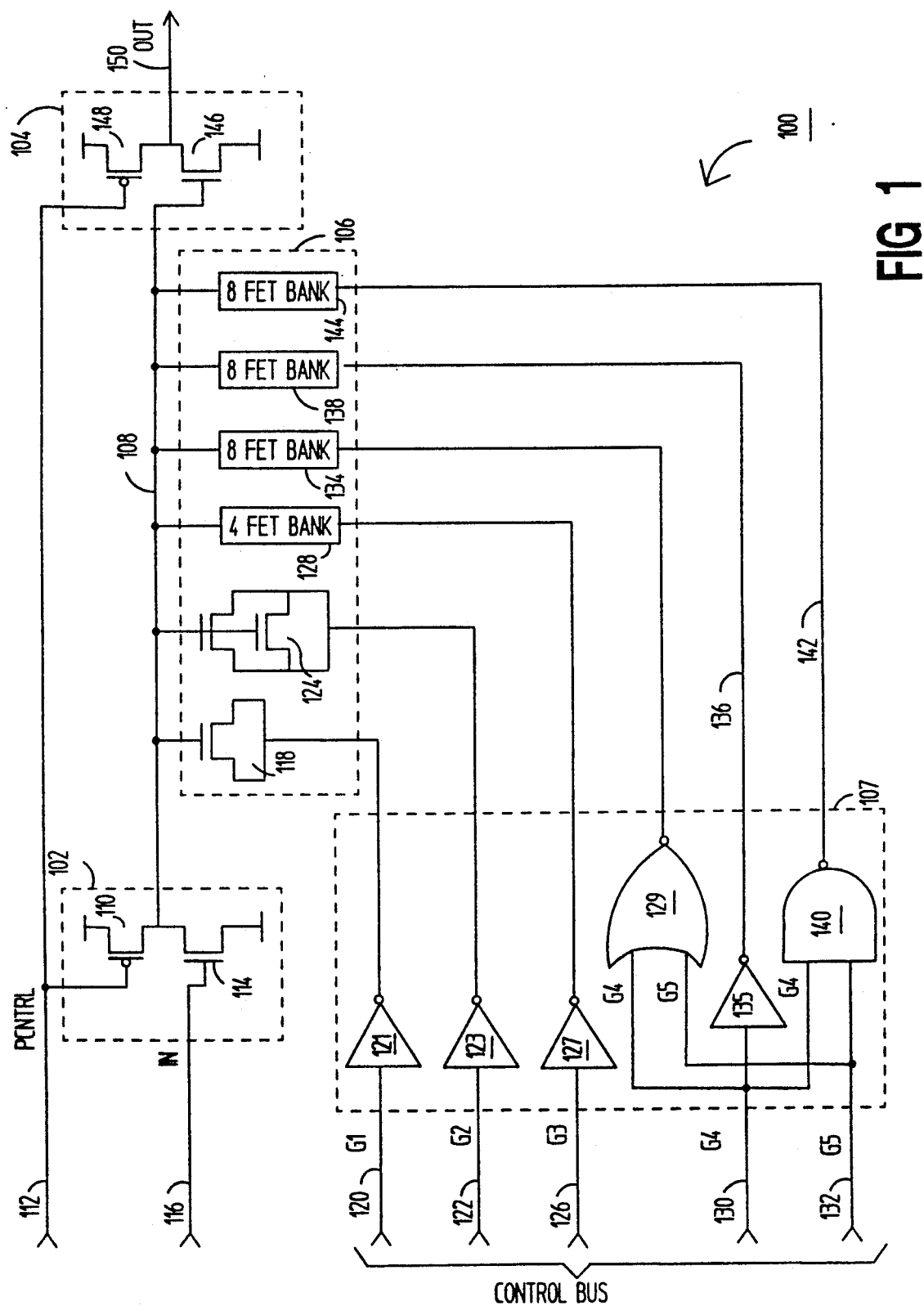
FIG. 1 shows a representative logic diagram of a pseudo-NMOS delay element embodiment of the present invention.

The present invention provides a system and method that can be used for integrated circuit testing in computer test systems by providing fine tuning of a coarse timing edge input signal. This fine tuning is provided by programmable capacitance on the internal node of a buffer and controlling the charging current into the programmable capacitance. This finely placed edge is useful in any measurement of stimulus application.

In accordance with the present invention, the architecture comprises a pseudo-NMOS buffer, which is made up of two pseudo-NMOS inverters with a programmable capacitance added to an internal node between the inverters. The pseudo-NMOS circuit provides fine tuning of a negative timing edge of an input signal. The gates of the PMOS FETs of the pseudo-NMOS inverters are driven by the output signal (PCNTRL) of a variable width current mirror digital-to-analog converter (DAC). As discussed in related application Ser. No. 786,690, an independent variable N is a digital input signal to the DAC and the transfer function between the output signal of the current mirror and the digital input signal is inversely dependent on N. Since the DAC is referenced to a stable fixed current source, the PCNTRL signal automatically adjusts with temperature and power supply variations. Therefore, temperature and power supply compensation is provided for the pseudo-NMOS inverters.

The control voltage PCNTRL regulates the charging current (current mirrored from the DAC) into the variable capacitance and is used for adjusting the delay of the buffer. For the present invention, the control voltage PCNTRL is used for nulling process variations and thus obtaining a nominal delay regardless of process. The control voltage PCNTRL is driven by the variable width current mirror DAC. By changing the mirror ratio of the DAC, the charging current changes. Therefore, the delay element delay is modulated. The time to charge the internal node is inversely proportional to the charging current. However, the charging current is inversely proportional to the DAC FET width. Therefore, the end result is that the delay increases proportionately to the DAC FET width.

The variable capacitance in connection with the present invention is obtained by modulating the gate-source voltage ($V_{GSS}$) of an NMOS FET. The gate of the NMOS FET is connected to the internal node of the buffer. The source and drain electrodes are shorted together. The gate capacitance is effectively switched in or out of the circuit by driving the source drain node to the negative or positive supply voltage, respectively. Several of these capacitors are attached to the internal node. Thus, small finely controlled amounts of capacitance can be added to the internal node via digital control. As is evident to those skilled in the art, the size of the capacitor FET is chosen corresponding to the fine timing resolution required by an application of the present invention. The number of capacitors attached to the internal node is determined by the dynamic range requirements. Since the delay of the element is linearly dependent on the capacitance of the internal node, this technique offers a linear relationship between the programmed capacitor setting and the delay of the circuit. For the present invention, the higher order capacitors are implemented as capacitor banks in order to reduce non-linearities.

This pseudo-NMOS implementation is utilized for delaying negative timing edges. Further embodiments of the present invention include pseudo-PMOS circuits for controlled delay of positive timing edges. See FIG. 2, for example. Still further embodiments of the present invention include pseudo-NMOS/PMOS circuits for controlled delay of both negative and positive edges. This particular delay can be accomplished by either alternating a pseudo-PMOS element and a pseudo-NMOS element or by constructing an element with both PMOS and NMOS control voltages.

In brief, The present invention is a system and method for precisely controlling the delay of a buffer (delay element). This precise control is achieved by controlling the charging current into the programmable capacitance on the internal node of the buffer, so as to provide a finely controlled delay on a coarse timing edge input signal in order to finely control the output. The present invention is shown at a high level architectural perspective in FIG. 1.

Referring now to FIG. 1, a logic diagram is shown of the structure comprising a preferred embodiment of a pseudo-NMOS (PNMOS) delay element 100 of the present invention. The PNMOS delay element 100 comprises an inverter 102 and an inverter 104, and various capacitor banks 106, driven by a decode circuitry 107 and connected in parallel to an internal node 108.

The inverter 102 comprises a PMOS FET 110. The gate electrode of FET 110 is connected to a bus 112 which carries a control signal PCNTRL. The PMOS FET 110 always remains on, but its conductance is adjustable by changing voltage of the PCNTRL signal. The PCNTRL signal is an adjustable voltage that is adjusted so as to modulate the charging of the capacitance on the internal node 108.

The inverter 102 also comprises an NMOS FET 114. The NMOS FET 114 receives a data input signal IN on line 116 connected to its gate. The PMOS FET 104 and the NMOS FET 114 function together to invert the data input signal 116. An inverted output signal from the inverter 102 is delayed on node 108 by the previously mentioned various capacitor banks 106 that are connected in parallel to the node 108.

The lower order capacitor banks (FET banks comprised of less than 8 FETs) are rendered active by control signals G1-G3. Once active, i.e., turned on, the transistors act like capacitors and sink charge from the node 108 to thereby delay a signal propagating from inverter 102 to inventor 104. Control signals G1-G3 are Boolean coded to apply additional capacitance to the node 108 in a linear fashion. The higher order bits (FET banks comprised of 8 or more FETs) are rendered active by control signals G4 and G5. The control signals G4 and G5 are thermometer encoded to minimize device mismatch due to process tolerances. See the above incorporated copending application Ser. No. 07/786,690 for a further discussion of thermometer decoding.

A first capacitor bank 118 comprises one NMOS FET with its gate connected in parallel to the node 108 as well as a short-circuited source-drain node which is controlled by a gate-control input signal G1 on line 120 which is logically inverted and buffered by an inverter 121. The input signal G1 is the least Significant Bit (LSB) of the control word comprising input signals G1-G5. A gate-control input signal G2 on line 122 is inverted and buffered by an inverter 123 and controls the short-circuited source-drain node of a pair of parallel connected FETs forming the capacitor bank 124. The capacitor bank 124 is connected to the node 108 so as to control the next significant bit on the node 108. A gate-control input signal G3 on line 126), which is inverted by an inverter 127, controls a group of four FETs forming a capacitor bank 128, which is connected in parallel, via the gates of capacitor bank 128, to the node 108 so as to control the next significant bit of the node 108. A logical NOR 129 of a gate-control input signal G4 on line 130 and gate-control input signal G5 on line 132 controls the source-drain node of a capacitor bank 134, comprising eight NMOS FETs, that provide the next significant bit of delay to node 108. An inverter 135 provides an inverted output signal 136 of the gate-control input signal G4. Output signal 136 controls the source-drain node of a capacitor bank 138, comprising eight NMOS FETs that provide a capacitance delay for the next significant bit on the node 108. Gate-control input signals G4 and G5 are applied to respective inputs of a logical NAND 140. An output signal 142 of logical NAND 140 controls the source-drain node of a capacitor bank 144. The capacitor bank 144 comprises eight NMOS FETs that provide a capacitance delay for the MSB (Most Significant Bit) to node 108.

Note that the FET of the first four capacitor banks are arranged in a binary fashion, (1, 2, 4, 8) so as to achieve the programmed capacitance capabilities offered by a binary decode provided to inputs G1 through G3. The two MSBs, G4 and G5, are decoded in a thermometer fashion such that capacitor bank 138 consists of eight NMOS FETs instead of the next binary equivalent of sixteen. The thermometer decode is such that the three 8 FET capacitor banks, 134, 138 and 144, turn on monotonically as the input signal G4 and the input signal G5 increase from a binary zero ($00_2$) to a binary three ($11_2$).

The delayed output signal on node 108 provided by the capacitor banks 106 connected to node 108 is a data input signal to the gate of an NMOS FET 146 of the inverter 104. The inverter 104 comprises the NMOS FET 146 and a PMOS FET 148, with the PCNTRL signal connected to the gate of the PMOS FET 148 so that its conductivity is adjustable by changing the PCNTRL signal. The delayed data input signal on node 108 is then reinverted to provide a data output signal OUT on line 150 that is logically consistent with the data input signal IN on line 116.

Figure 2:
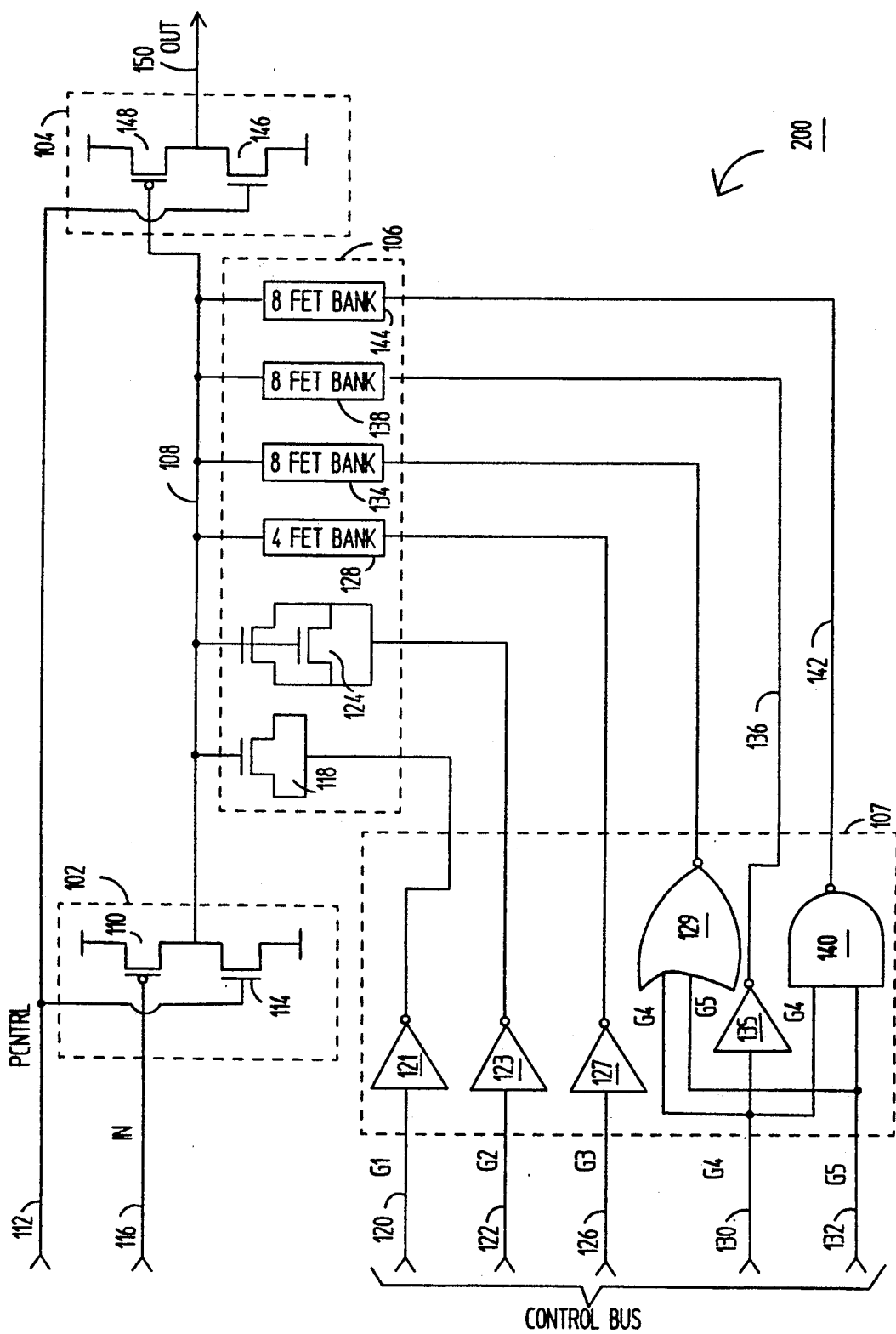
FIG. 2 shows a representative logic diagram of a pseudo-PMOS delay element embodiment of the present invention.

Referring now to FIG. 2, a pseudo-PMOS delay element 200 has the input IN connected to the gate of the p-channel FET 110 of the first inverter 102. The output 108 of the first inverter 102 is connected to the gate of the p-channel FET 148 of the second inverter 104, and the control signal 112 is connected to the gate of the n-channel FETs 114 and 146. This reversal of the control signal and input signals permits controlled delay of positive timing edges.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. A pseudo-NMOS inverter comprising:
   (a) a first field effect transistor (FET) having first gate, source, and drain electrodes;
   (b) an second FET having second gate, source, and drain electrodes, said second gate electrode forming an input to the inverter, and said second drain electrode being connected to said first drain electrode to thereby form an output node of the inverter;
   (c) means for connecting a voltage supply to said first source and said second source electrodes; and
   (d) means for applying an adjustable control voltage to said first gate electrode to thereby determine the conductivity of said first FET, said adjustable control voltage substantially offsets temperature and voltage supply variations, wherein changing said adjustable voltage regulates the amount of current flowing from the voltage supply to said output node.

2. A delay element for fine tuning the position in time of timing edges of an input signal, comprising:
   (a) a first and a second inverter, each comprising a data input, a control input, a data output, and connections for applying a voltage supply to said inverters;
   (b) a node defining a connection between said data output of said first inverter and said data input of said second inverter;
   (c) an adjustable control voltage for applying a biasing voltage to said first and second control inputs to thereby control the amount of charge supplied to said node by the voltage supply, said adjustable control voltage substantially offsets temperature and voltage supply variations; and
   (d) a variable capacitance means connected to said node for applying finite amounts of capacitance to said node to delay and thereby fine tune in time the timing edges of the input signal propagating from said first inverter to said second inverter.

3. A delay element for fine tuning the position in time of timing edges of an input signal, comprising:
   (a) a first and a second inverter, each comprising a data input, a control input, and a data output;
   (b) a node defining a connection between said data output of said first inverter and said data input of said second inverter;

(c) an adjustable control voltage for applying a biasing voltage to said first and second control inputs to thereby control the amount of charge supplied to said node; and (d) a variable capacitance means connected to said node for applying finite amounts of capacitance to said node to delay and thereby fine tune in time the timing edges of the input signal propagating from said first inverter to said second inverter, said variable capacitance having:

(i) decoder means for decoding an input control word and generating at least one control signal; and (ii) at least one capacitor bank coupled to said decoder means and to said node for applying said finite amounts of capacitance to said node as a function of said at least one control signal.

4. A delay element according to claim 3, wherein said decoder means comprises a plurality of bits to thereby provide programmability of at least one capacitor bank.

5. A delay element according to claim 2, wherein said first and second inverters each comprises:

(a) a first Field Effect Transistor (FET) having first gate, source, and drain electrodes;

(b) a second FET having second gate, source, and drain electrodes, said second gate electrode forming an input to the respective inverter, and said second drain electrode being connected to said first drain electrode to thereby form an output node of the respective inverter;

(c) means for permitting a voltage supply to be connected to said first source and said second source electrodes; and (d) means for applying an adjustable control voltage to said first gate electrode to thereby determine the conductivity of said first FET, wherein changing said adjustable control voltage regulates the amount of current flowing from the voltage supply to said output node.

6. A delay element according to claim 5, wherein said first FET is a p-channel FET and said second FET is an n-channel FET and the combination of said p-channel and n-channel FETs forms a pseudo-NMOS inverter.

7. A delay element according to claim 6 which is utilized for delaying negative timing edges.

8. A delay element according to claim 5, wherein said first FET is an n-channel FET and said second FET is a p-channel FET and the combination of said n-channel and p-channel FETs forms a pseudo-PMOS inverter.

9. A delay element according to claim 8 which is utilized for delaying positive timing edges.

10. A delay element according to claim 3, wherein said at least one capacitor bank comprises at least one FET having gate, source and drain electrodes, said gate electrode being coupled to said node and said source and drain electrodes being coupled together and coupled to said decoder means to thereby form a FET capacitor to provide said finite amount of capacitance.

* * * * *